(12) United States Patent
Kanda et al.

(10) Patent No.: US 9,865,834 B2
(45) Date of Patent: Jan. 9, 2018

(54) METHOD OF MANUFACTURING AN ORGANIC EL DISPLAY DEVICE, AND ORGANIC EL DISPLAY DEVICE

(71) Applicant: Japan Display Inc., Tokyo (JP)

(72) Inventors: Noriyoshi Kanda, Tokyo (JP); Masakazu Kaida, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/091,731

(22) Filed: Apr. 6, 2016

(65) Prior Publication Data

US 2016/0293903 A1    Oct. 6, 2016

(30) Foreign Application Priority Data

Apr. 6, 2015  (JP) ................. 2015-078053

(51) Int. Cl.
*H01L 51/56*  (2006.01)
*H01L 51/52*  (2006.01)
*H01L 27/32*  (2006.01)

(52) U.S. Cl.
CPC ...... *H01L 51/5218* (2013.01); *H01L 27/3244* (2013.01)

(58) Field of Classification Search
CPC ................... H01L 51/5218; H01L 27/3244
See application file for complete search history.

(56) References Cited

U.S. PATENT DOCUMENTS

| | | | | |
|---|---|---|---|---|
| 2005/0184980 | A1* | 8/2005 | Sato | G09G 3/3648 345/204 |
| 2005/0260335 | A1* | 11/2005 | Kimura | H01L 27/3211 427/58 |
| 2006/0267481 | A1* | 11/2006 | Chang | H01J 31/123 313/496 |
| 2008/0032215 | A1* | 2/2008 | Lai | G02B 5/201 430/7 |
| 2009/0236962 | A1* | 9/2009 | Fujimoto | H01L 51/5203 313/348 |

(Continued)

FOREIGN PATENT DOCUMENTS

| | | |
|---|---|---|
| JP | H09-199481 A | 7/1997 |
| JP | 2003-107511 A | 4/2003 |
| KR | 10-2012-0039871 A | 4/2012 |

OTHER PUBLICATIONS

Korean Office Action dated Jun. 19, 2017 for corresponding KR Patent Application No. 10-2016-0041004, with translation.

(Continued)

*Primary Examiner* — Peter Bradford

(74) *Attorney, Agent, or Firm* — Typha IP LLC

(57) ABSTRACT

A method of manufacturing a display device includes forming a three-layer laminate by laminating a first transparent conductive film, a metal film, and a second transparent conductive film in order from a substrate side. The three-layer laminate forms a plurality of anode electrodes arranged in a pixel region and a plurality of dummy electrodes arranged on an outer side of the pixel region. The method of manufacturing a display device also includes subjecting the second transparent conductive film and the metal film to etching and subjecting the first transparent conductive film to etching. A density of a pattern of the plurality of dummy electrodes is reduced as a distance from the pixel region is increased.

11 Claims, 14 Drawing Sheets

(56) References Cited

U.S. PATENT DOCUMENTS

| | | | |
|---|---|---|---|
| 2014/0225077 A1* | 8/2014 | Yun | H01L 51/525 257/40 |
| 2015/0084912 A1* | 3/2015 | Seo | G06F 3/0412 345/174 |
| 2015/0311269 A1* | 10/2015 | Hsu | H01L 27/3218 257/88 |

OTHER PUBLICATIONS

Chinese Office Action dated Jul. 20, 2017 for corresponding CN Patent Application No. 201610210131.1, with translation.

* cited by examiner

IN PROCESSING

PROCESSING COMPLETED

PROCESSING START

IN PROCESSING

PROCESSING COMPLETED

METHOD OF MANUFACTURING AN ORGANIC EL DISPLAY DEVICE, AND ORGANIC EL DISPLAY DEVICE

CROSS-REFERENCE TO RELATED APPLICATION

The present application claims priority from Japanese application JP 2015-78053 filed on Apr. 6, 2015, which is incorporated by reference into this application.

BACKGROUND OF THE INVENTION

1. Field of the Invention

The present invention relates to a method of manufacturing a display device, and to a display device.

2. Description of the Related Art

As disclosed, for example, in Japanese Patent Application Laid-open No. Hei 09-199481, in some cases, alloy wiring having an Al base is used as multi-layer wiring of a semiconductor device. In those cases, the alloy wiring contains different types of metal such as Cu and Si, and due to the difference in etching rate therebetween, etching residues of Cu, Si, or other types are generated. As a result, wiring short-circuit or other problems may be caused. Then, in order to suppress the generation of the residues, in Japanese Patent Application Laid-open No. Hei 09-199481, there is disclosed a technology involving forming, in an etching step of forming the alloy wring, dummy wiring in a wide part of a substrate in which actual wiring or the like is not formed, to thereby suppress the generation of the residues in the etching step.

SUMMARY OF THE INVENTION

Incidentally, in a display device using a self-emission element called an organic electro-luminescent (EL) element typified by an organic light emitting diode, as an anode reflective electrode, for example, a three-layer laminate obtained by laminating ITO, Ag, and ITO in order is used.

In this case, the anode reflective electrode is formed by, for example, two stages of wet etching using mixed acid (phosphoric-nitric-acetic acid) and oxalic acid. Specifically, for example, as illustrated in FIG. 11A and FIG. 11B, an ITO layer 111 and a Ag layer 112 on the surface are first subjected to etching by mixed acid, and then, as illustrated in FIG. 11O and FIG. 11D, an ITO layer 113 below the Ag layer 112 is subjected to etching by oxalic acid. Note that, FIG. 11A is a view during the etching processing of the first stage, FIG. 11B is a view after the etching of the first stage is completed. FIG. 11C and FIG. 11D are views during the etching processing of the second stage, and FIG. 11E is a view after the etching processing of the second stage is completed.

In this case, as illustrated in FIG. 11D, residues 114 of the Ag layer 112 may be generated at a stage at which the etching by the mixed acid is completed, and the residues 114 of the Ag layer 112 may be lifted off by the next etching by the oxalic acid. The Ag layer 112 is insoluble to oxalic acid, and hence the lifted-off residues 114 of the Ag layer 112 float as particles in the oxalic acid. This state may cause short-circuit in a pixel circuit or other problems. As illustrated in FIG. 11A to FIG. 11D, a resist 115 is arranged in a part to be prevented from being processed by the etching described above. Further, the ITO layer 113 is arranged on a substrate 116 having TFTs and other components formed thereon. Next, as shown in FIG. 11E, as explained using FIG. 11D, after the residues 114 are lifted off, the ITO layer 113 is removed at the opening of the resist 115, the substrate 116 is exposed at the part where the ITO 113 is removed, so that the etching process is completed.

In view of this, one or more embodiments of the present invention has an object to provide a method of manufacturing a display device, which is capable of reducing residues in forming, for example, the anode reflective electrode by etching, and to provide a display device having fewer residues.

(1) A method of manufacturing a display device includes forming a three-layer laminate by laminating a first transparent conductive film, a metal film, and a second transparent conductive film in order from a substrate side. The three-layer laminate forms a plurality of anode electrodes arranged in a pixel region and a plurality of dummy electrodes arranged on an outer side of the pixel region. The method of manufacturing a display device also includes subjecting the second transparent conductive film and the metal film to etching and subjecting the first transparent conductive film to etching. A density of a pattern of the plurality of dummy electrodes is reduced as a distance from the pixel region is increased.

(2) In the method of manufacturing a display device according to (1), an area of each of the plurality of dummy electrodes is reduced as the distance from the pixel region is increased.

(3) In the method of manufacturing a display device according to (1), a number of the plurality of dummy electrodes is reduced as the distance from the pixel region is increased.

(4) In the method of manufacturing a display device according to one of (1) to (3), the etching of the second transparent conductive film and the metal film is carried out under a state in which the substrate is inclined.

(5) In the method of manufacturing a display device according to (4), the density of the pattern of the plurality of dummy electrodes is reduced in a direction toward an upstream side of a flow of an etchant, which is caused by the inclination.

(6) In the method of manufacturing a display device according to one of (1) to (5), the metal film is made of silver.

(7) In the method of manufacturing a display device according to one of (1) to (6) the first transparent conductive film and the second transparent conductive film are made of ITO.

(8) In the method of manufacturing a display device according to one of (1) to (7), the etching of the first transparent conductive film is carried out by oxalic acid.

(9) In the method of manufacturing a display device according to one of (1) to (8), the etching of the second transparent conductive film and the metal film is carried out by mixed acid.

(10) In the method of manufacturing a display device according to one of (1) to (9), the plurality of dummy electrodes are arranged on an upstream side of an etchant used in the etching of the metal film.

(11) In the method of manufacturing a display device according to one of (1) to (10), the plurality of dummy electrodes are arranged adjacent to a plurality of dummy pixels arranged adjacent to and on the outer side of the pixel region.

(12) A display device includes a plurality of anode electrodes arranged in a pixel region and a plurality of dummy electrodes arranged on an outer side of the pixel region. A density of a pattern of the plurality of dummy electrodes is reduced as a distance from the pixel region is increased.

DETAILED DESCRIPTION OF THE INVENTION

Figure 1:
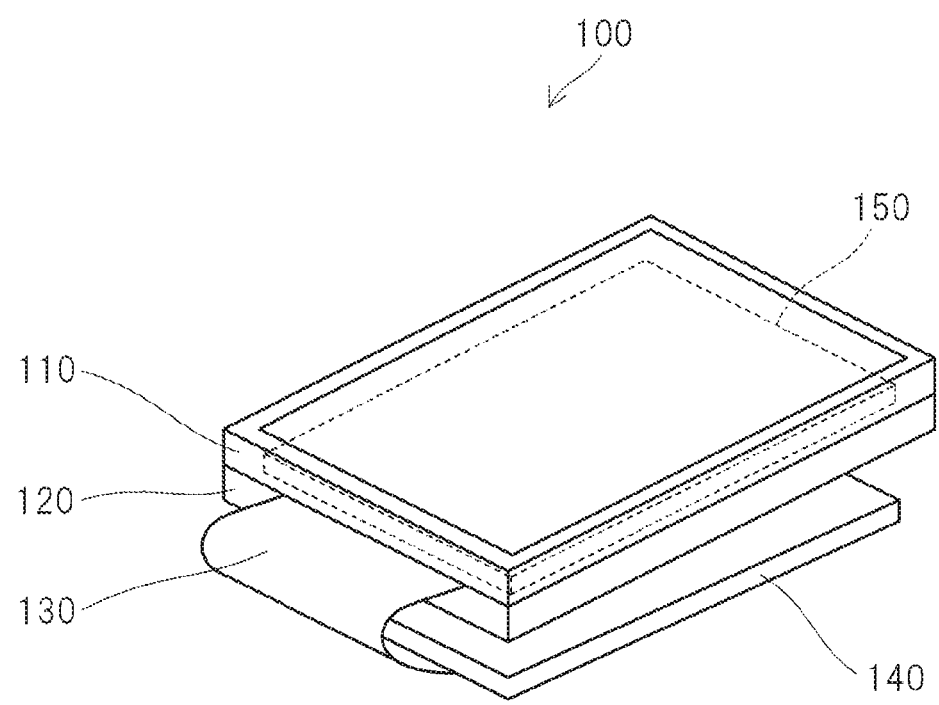
FIG. 1 is a schematic illustration of an example of a display device according to an embodiment of the present invention.

Referring to the accompanying drawings, an embodiment of the present invention is described below. In the drawings, the same or similar components are denoted by the same reference symbols, and repetitive description thereof is omitted.

FIG. 1 is a view for schematically illustrating an example of a display device 100 according to an embodiment of the present invention. As illustrated in FIG. 1, the display device 100 includes an upper frame 110 and a lower frame 120, which are configured to sandwich and fix a thin film transistor (TFT) substrate 150 having an organic EL panel mounted thereon, a circuit board 140 including a circuit element configured to generate information to be displayed, and a flexible board 130 configured to transmit RGB information generated in the circuit board 140 to the TFT substrate 150. The display device 100 illustrated in FIG. 1 is merely an example, and this embodiment is not limited thereto.

Figure 2:
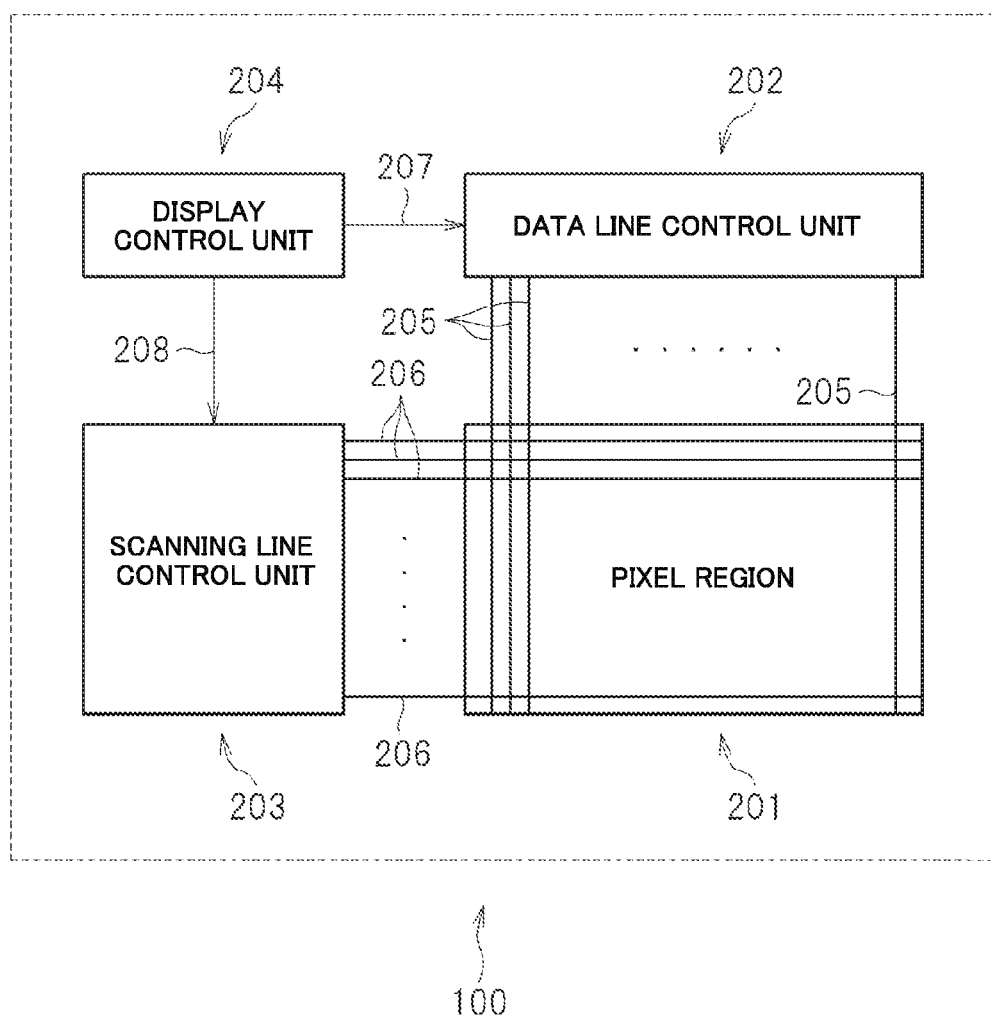
FIG. 2 is a diagram for illustrating an example of a functional configuration of the display device.

FIG. 2 is a diagram for illustrating an example of the functional configuration of the display device illustrated in FIG. 1. As illustrated in FIG. 2, the display device 100 includes a pixel region 201 configured, to display a display screen, a data line control unit 202, a scanning line control unit 203, and a display control unit 204. In FIG. 2, the display control unit 204, the data line control unit 202, and the scanning line control unit 203 are illustrated as different units, but those units may be formed as one unit.

The pixel region 201 includes a plurality of pixels (not shown) arranged in matrix. The plurality of pixels are each connected to a corresponding data line 205 and a corresponding scanning line 206. Each data line 205 is connected to the data line control unit 202, and further, each scanning line 206 is connected to the scanning line control unit 203. In addition, a drive voltage supply line 307 configured to drive a drive transistor 303 or other lines is connected to the pixel region 201, but illustration thereof is omitted in FIG. 2 for simplification of description.

The display control unit 204 is connected to the data line control unit 202 and the scanning line control unit 203. The display control unit 204 is configured to input, for example, a control signal group (not shown), and to output a data line control signal 207 and a scanning line control signal 208 to the data line control unit 202 and the scanning line control unit 203, respectively, based on the control signal group. The data line control signal 207 and the scanning line control signal 208 include a control signal group of a horizontal synchronizing signal or other signals.

The data line control unit 202 is configured to output a display voltage corresponding to a grayscale value to each pixel via each data line 205 based on the data line control signal 207 from the display control unit 204.

The scanning line control unit 203 is configured to output a scanning signal for controlling a TFT switch (not shown) arranged in each pixel via each scanning line 206 based on the scanning line control signal 208 from the display control unit 204.

Based on the display voltage and the scanning signal from the data line control unit 202 and the scanning line control unit 203, respectively, each pixel is controlled to emit light.

Figure 3:
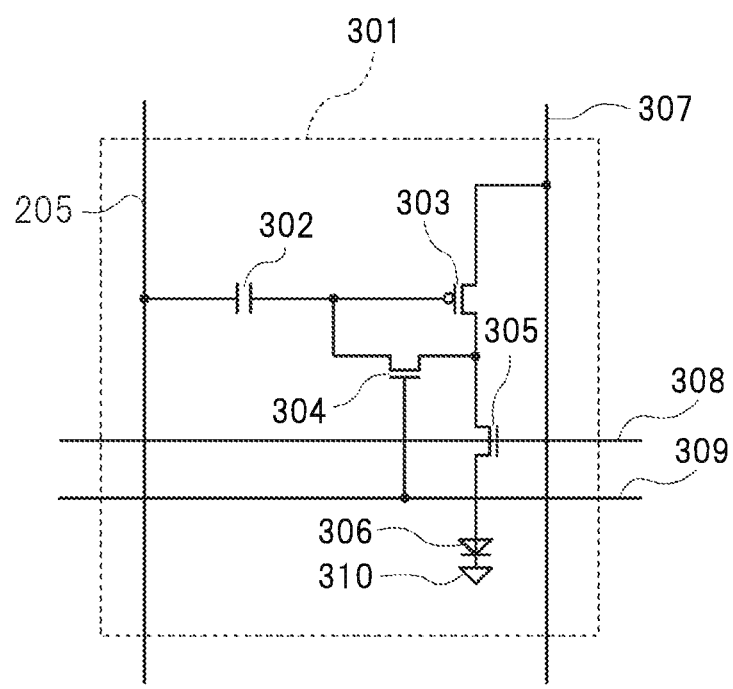
FIG. 3 is a diagram for illustrating an example of a circuit configuration of each pixel.

FIG. 3 is a diagram for illustrating an example of the circuit configuration of each pixel. As illustrated in FIG. 3, each pixel 301 includes, for example, a holding capacitor 302, the drive transistor 303, a writing control switch 304, a light emission control switch 305, and an organic EL element 306.

The holding capacitor 302 is connected to the data line 205 and the drive transistor 303. A gate of the drive transistor 303 is connected to the holding capacitor 302, one of a source and a drain thereof is connected to the drive voltage supply line 307, and the other thereof is connected to the light emission control switch 305.

A gate of the light emission control switch 305 is connected to a light emission control line 308, one of a source and a drain thereof is connected to the output side of the drive transistor 303, and the other thereof is connected to the organic EL element 306.

A gate of the writing control switch 304 is connected to a writing control line 309, one of a source and a drain thereof is connected to the gate of the drive transistor 303, and the other thereof is connected to the output side of the drive transistor 303 and the organic EL element 306. One end of the organic EL element 306 is connected to the light emission control switch 305, and the other end thereof is connected to a ground 310.

Figure 4A:
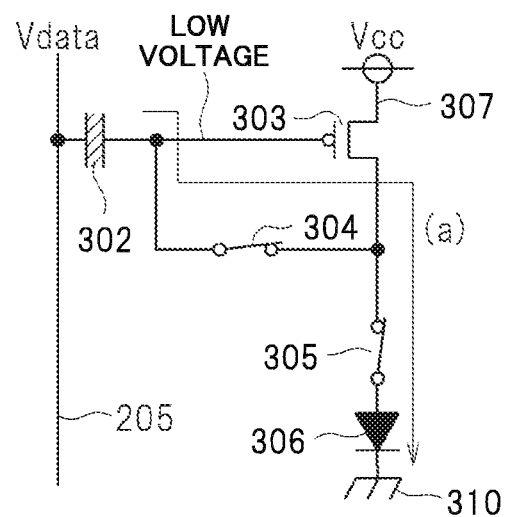
FIG. 4A is a diagram for illustrating an example of an operation of each pixel.

Next, an example of the operation of the display device 100 is described. First, operations of each pixel 301 in a writing period and a light emission period are described. In the writing period, as illustrated in FIG. 4A to FIG. 4C, a pre-charge operation, a writing operation, and a non-writing state operation are performed in order, and then a light emission operation is performed in the light emission period.

In FIG. 4A to FIG. 4D, for simplification of description, the writing control switch 304 and the like are illustrated as symbols of switches and the like, but it is needless to say that the same reference symbols represent the same elements. Further, Vcc represents a drive supply voltage for driving the drive transistor 303, and the drive supply voltage is supplied by an external power supply (not shown), for example.

First, at a time T1, a display voltage (Vdata) corresponding to a video signal output to the data line 205 is output. Next, as illustrated in FIG. 4A, at a next time T2, the writing control switch 304 and the light emission control switch 305 are turned on. Thus, a current flows as indicated by the arrow (a), and a low voltage is applied to the gate of the drive transistor 303.

Figure 4B:
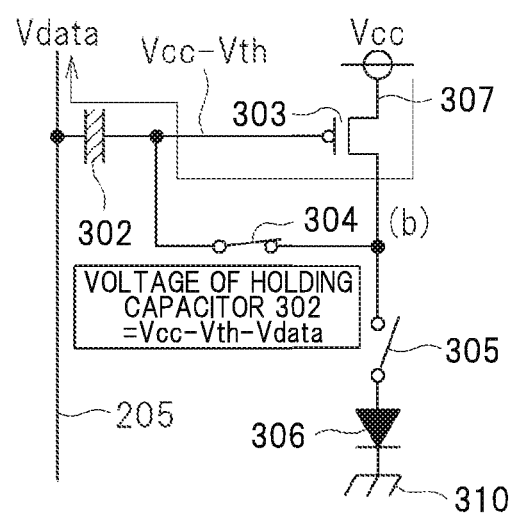
FIG. 4B is a diagram for illustrating the example of the operation of each pixel.
Figure 4C:
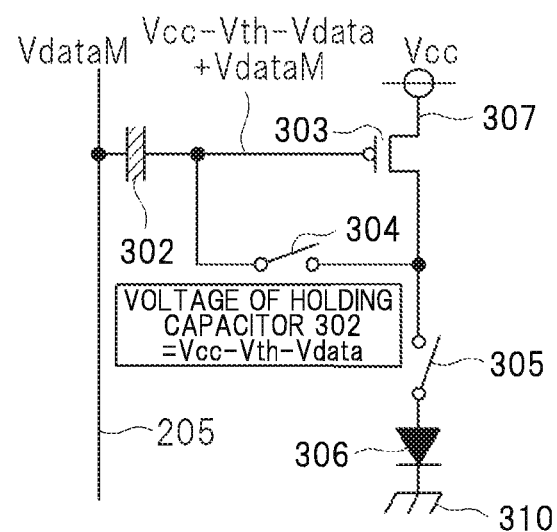
FIG. 4C is a diagram for illustrating the example of the operation of each pixel.

At a next time T3, as illustrated in FIG. 4B, the light emission control switch 305 is turned off, and the voltage of the gate of the drive transistor 303 becomes Vcc-Vth, which is a difference between the voltage Vcc of the drive voltage supply line 307 and a threshold voltage Vth of the drove transistor 303. At this time, the voltage of the holding capacitor 302 is Vcc-Vth-Vdata. At this time, a current flows as indicated by the arrow (b).

At a next time 14, as illustrated in FIG. 4C, the writing control switch 304 is turned off, and writing of other pixels is performed. At this time, the voltage of the holding capacitor 302 is held.

Figure 4D:
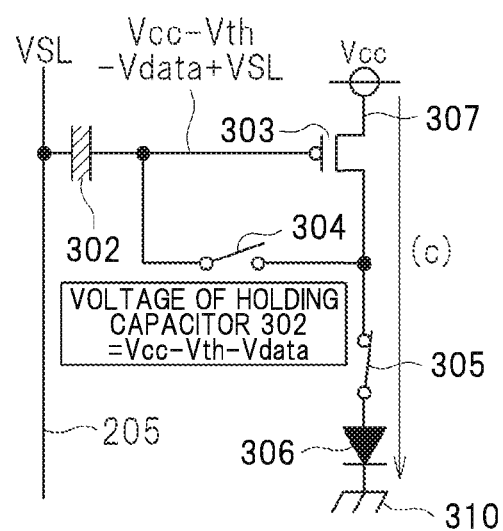
FIG. 4D is a diagram for illustrating the example of the operation of each pixel.

At a next time T5, as illustrated in FIG. 4D, a reference voltage (hereinafter represented by "VSL") is applied to all of the data lines 205, and the light, emission control switch 305 is turned on. With this, a current corresponding to Vcc-Vth-Vdata+VSL flows through the organic EL element 306, and the organic EL element 306 emits light. By repeating the operation as described above, each pixel 301 is driven. The configuration and the operation of each pixel 301 described above are merely an example, and this embodiment is not limited to the above.

Figure 5A:
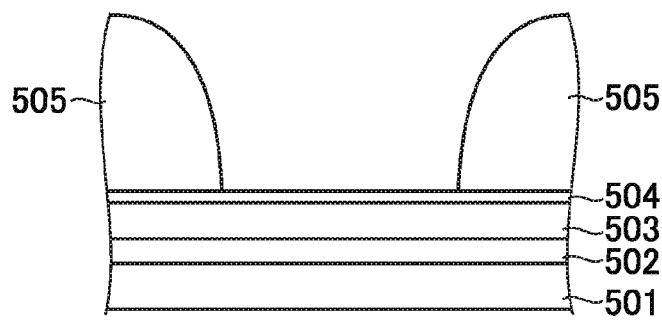
FIG. 5A is a view for illustrating an etching step in a method of manufacturing a display device.

Next, a method of manufacturing the display device 100 according to this embodiment is described. As illustrated in FIG. 5A, first, on a substrate 601, for example, a TFT layer 501 is formed, which includes wiring and TFTs each forming the drive transistor 303.

Next, as illustrated in FIG. 5A, on the above-mentioned TFT layer 501, a first transparent conductive film 502 (bottom indium tin oxide (ITO)), a metal film, 503 (Ag), and a second transparent conductive film 504 (Top ITO) are laminated in order. In the display device 100, the metal film 503 functions as a reflective film, and a so-called anode reflective electrode (anode electrode) is formed of a three-layer laminate including the first transparent conductive film 502, the metal film 503, and the second transparent conductive film 504. Further, the thickness of the second transparent conductive film 504 may be for example, about 30 nm, the thickness of the metal film 503 may be, for example, about 150 nm, the thickness of the first transparent conductive film 502 may be, for example, about 30 nm, and the thickness of the TFT layer 501 may be, for example, about 200 nm. Further, the three-layer laminate is merely an example, and this embodiment is not limited thereto.

Next, as illustrated in FIG. 5A, a resist 505 is applied at predetermined positions on the substrate 601 having the above-mentioned three-layer laminate and the like formed thereon, such as positions at which anode electrodes 802 (lower electrodes) of the pixels, anode electrodes (dummy anode electrodes) 803 for forming dummy pixels, and dummy electrodes 801, which are all described later, are formed.

Figure 5B:
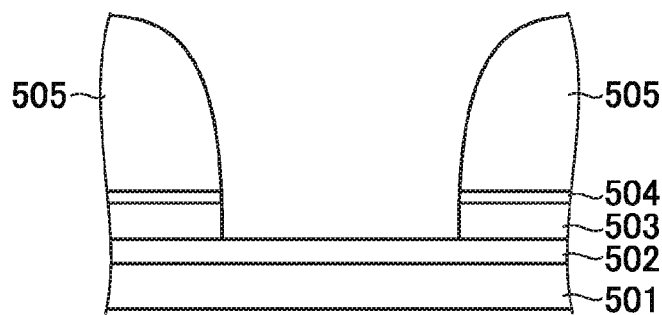
FIG. 5B is a view for illustrating an etching step in the method of manufacturing a display device.

Next, the second transparent conductive film 504 and the metal film 503 are subjected to etching (first etching) by mixed acid. With this, as illustrated in FIG. 5B, unnecessary parts of the second transparent conductive film 504 and the metal film 503 are removed.

Figure 5C:
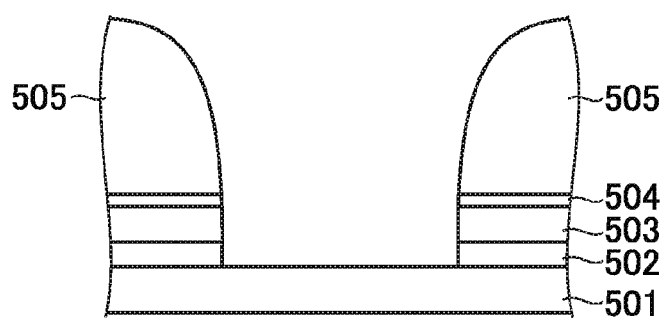
FIG. 5C is a view for illustrating an etching step in the method of manufacturing a display device.

Next, the first transparent conductive film 502 is subjected to etching (second etching) by oxalic acid. With this, as illustrated in FIG. 5C, unnecessary parts of the first transparent conductive film 502 are removed.

Figure 6A:
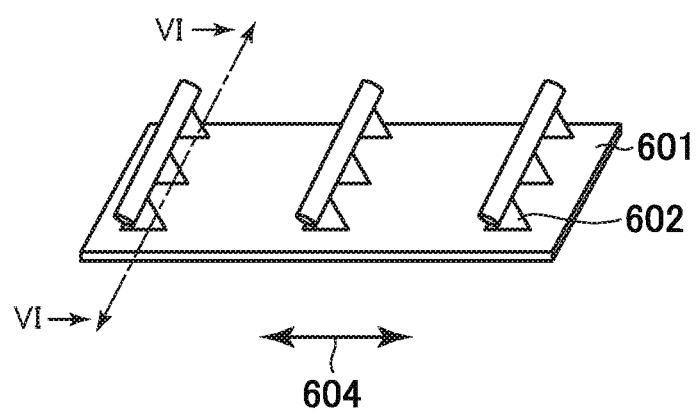
FIG. 6A is a view for illustrating an etching step in the method of manufacturing a display device.
Figure 6B:
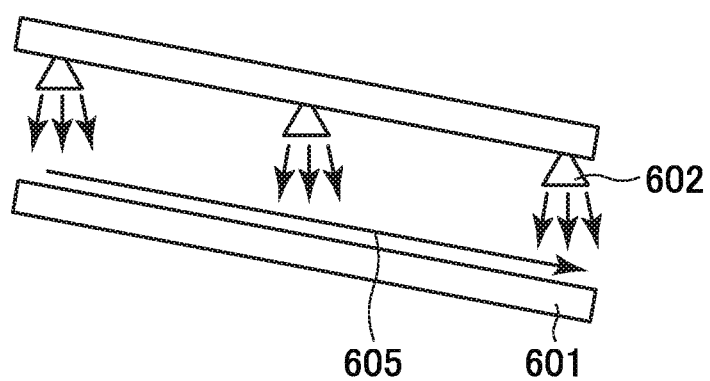
FIG. 6B is a view for illustrating an example of a VI-VI cross section of FIG. 6A.

In this case, the first etching and the second etching described above are performed while moving the substrate 601 and further inclining the substrate 601 with respect to the horizontal direction as illustrated in FIG. 6A and FIG. 6B. FIG. 6B is a schematic illustration of a VI-VI cross section of FIG. 6A. Further, as illustrated in FIG. 6A and FIG. 6B, for example, an etchant is dropped from a plurality of nozzles 602 installed at predetermined intervals in vertical and lateral directions of the substrate 601. In this case, the substrate 601 corresponds to the substrate 601 having the first transparent conductive film 502, the metal film 503, the second transparent conductive film 504, and other films formed thereon as described above. Further, the arrow 604 in FIG. 6A indicates a moving direction of the substrate 601, and the arrow 605 in FIG. 6B indicates a direction in which the dropped etchant flows.

Figure 5D:
FIG. 5D is a view for illustrating an etching step in the method of manufacturing a display device.

Next, as illustrated in FIG. 5D, the resist 505 is removed.

Figure 7A:
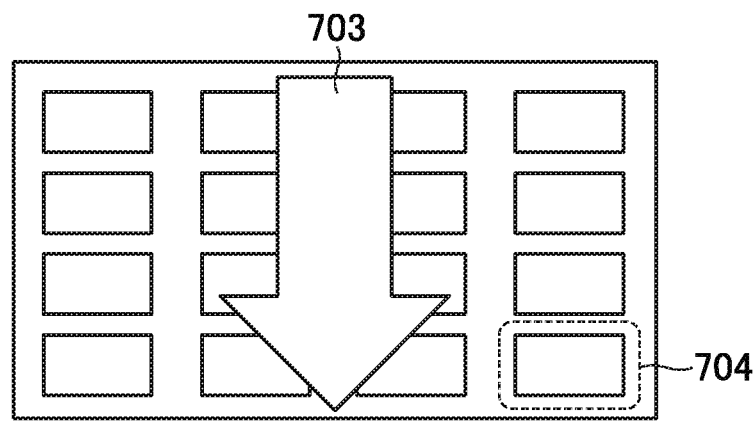
FIG. 7A is a view for illustrating formation of a dummy pattern.
Figure 7B:
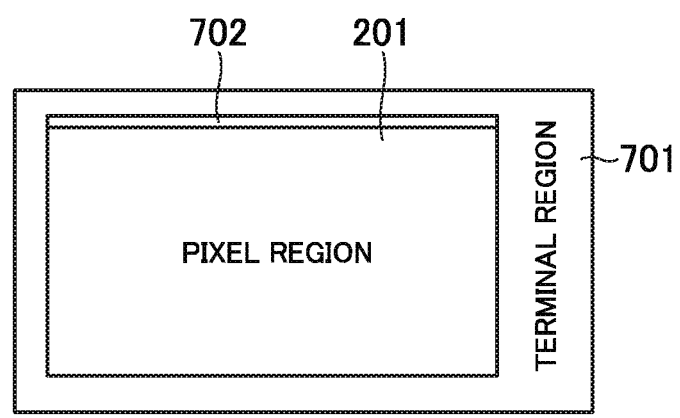
FIG. 7B is a view for illustrating formation of a dummy pattern.

Next, with reference to FIG. 7A and FIG. 7B, the arrangement position of the pattern of the dummy electrodes 801 is described. FIG. 7A is a view for illustrating a case where, as an example, a substrate having a plurality of pixel regions 201 formed thereon is used to subject the plurality of pixel regions 201 to etching at once. In FIG. 7A, the upper side corresponds to the upstream side of the inclination of the first etching and the second etching described above and corresponds to the left side in FIG. 6B, and the lower side corresponds to the downstream side of the inclination of the first etching and the second etching described above and corresponds to the right side in FIG. 6B. Further, the arrow 703 indicates a direction in which the etchant flows along with the inclination.

FIG. 7B is a view for illustrating in an enlarged manner the pixel region. 201 and a terminal region 701 surrounding the pixel region 201 (region 704 surrounded by the dotted line in FIG. 7A) of FIG. 7A. As illustrated in FIG. 7B, for example, the pattern of the plurality of dummy electrodes 801 (dummy pattern 702) to be described later is formed along one side of the pixel region 201 on the upstream side so as to be adjacent to the pixel region 201.

Figure 7C:
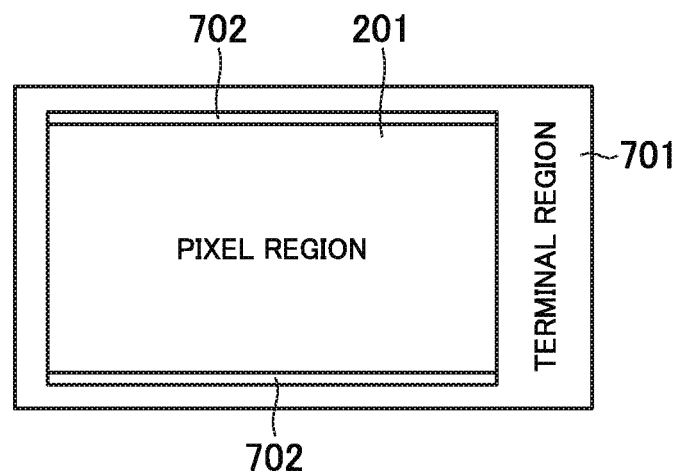
FIG. 7C is a view for illustrating formation of a dummy pattern.
Figure 7D:
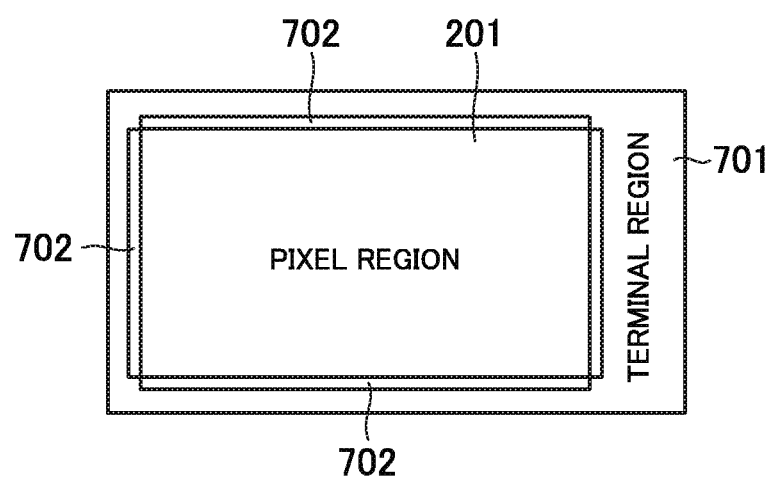
FIG. 7D is a view for illustrating formation of a dummy pattern.

Besides, the dummy pattern 702 may also be formed on the downstream side as illustrated in FIG. 7C, or may be formed along four sides of the pixel region 201 so as to be adjacent to the pixel region 201 as illustrated in FIG. 7D. Further, in FIG. 7A, one substrate 601 having the plurality of pixel regions 201 formed thereon is illustrated, but, for example, the dummy pattern 702 may be formed for the substrate 601 that has been cut for each single pixel region 201. Further, the pixel region 201 in FIG. 7A to FIG. 7D includes a dummy pixel region 804 to be described later, but for simplification of the figure, the dummy pixel region 804 is omitted in FIG. 7A to FIG. 7D.

Figure 8A:
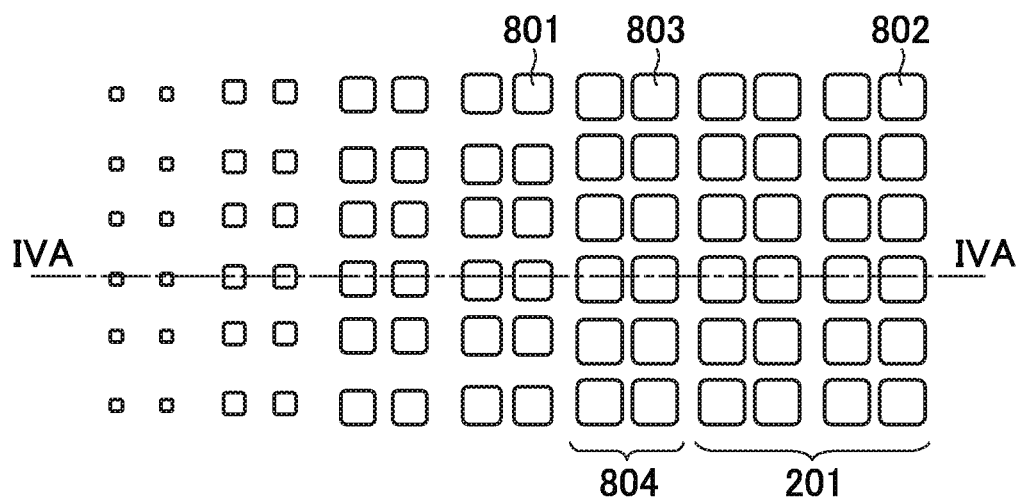
FIG. 8A is a view for illustrating an arrangement pattern of a plurality of dummy electrodes.

Next, the arrangement pattern of the plurality of dummy electrodes 801 in one dummy pattern 702 is described with reference to FIG. 8A and FIG. 8B. FIG. 8A is a plan view for illustrating an example of the arrangement pattern of the plurality of dummy electrodes 801. The shape of the dummy electrode 801 is merely an example, and this embodiment is not limited to the shape illustrated in FIG. 8A and FIG. 8B.

For example, the plurality of dummy electrodes 801 are arranged so that the density of the plurality of dummy electrodes 801 is reduced as the distance from the pixel region 201 is increased. For example, as illustrated in FIG. 8A, the plurality of dummy electrodes 801 are arranged so that the area of the dummy electrode 801 is reduced as compared to the anode electrode 802 formed in the pixel region 201 as the distance from the pixel region 201 is increased. More specifically, for example, in FIG. 8A, as an example, there is illustrated a case where the area is sequentially reduced by 20% for every two dummy electrodes 801 from the left side of the dummy pixel region 804.

Figure 8B:
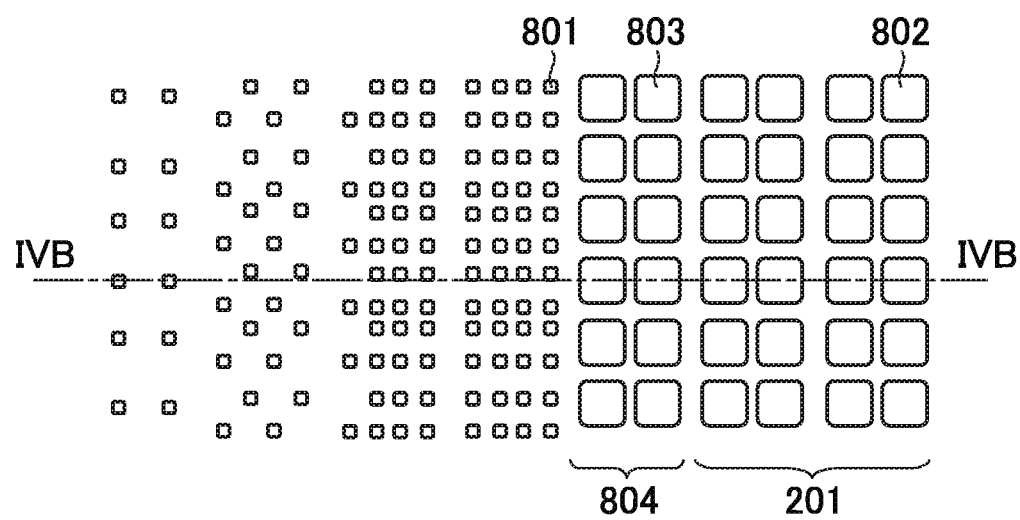
FIG. 8B is a view for illustrating an arrangement pattern of the plurality of dummy electrodes.

Further, as illustrated in FIG. 8B, for example, the plurality of dummy electrodes 801 may be arranged so that the number of the dummy electrodes 801 is reduced as the distance from the pixel region 201 is increased. More specifically, for example, in FIG. 8B, as an example, there is illustrated a case where the number of the dummy electrodes 801 is sequentially reduced by 20% for every two dummy electrodes 801 from the left side of the dummy pixel region 804.

The size of the dummy electrode 801 is desired to be, for example, 1.5 µm or more in one-side length when the shape of the dummy electrode 801 is assumed to be a square in plan view. With this, the lift off of the dummy electrode 801 itself can be more effectively prevented. Further, the arrangement pattern illustrated in FIG. 8A and FIG. 8B described above is merely an example, and other patterns may be employed as long as the density of the dummy electrodes 801 is reduced as the distance from the pixel region is increased. For example, both of the number and the area of the dummy electrodes 801 may be reduced.

Figure 9A:
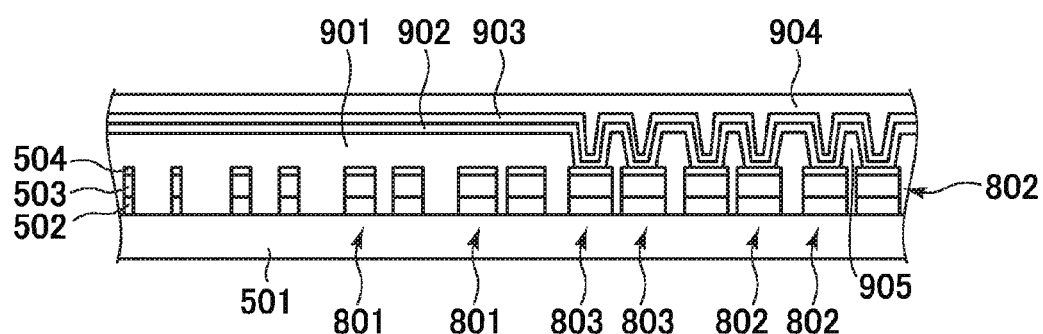
FIG. 9A is a view for illustrating an example of an IVA-IVA cross section of FIG. 8A.
Figure 9B:
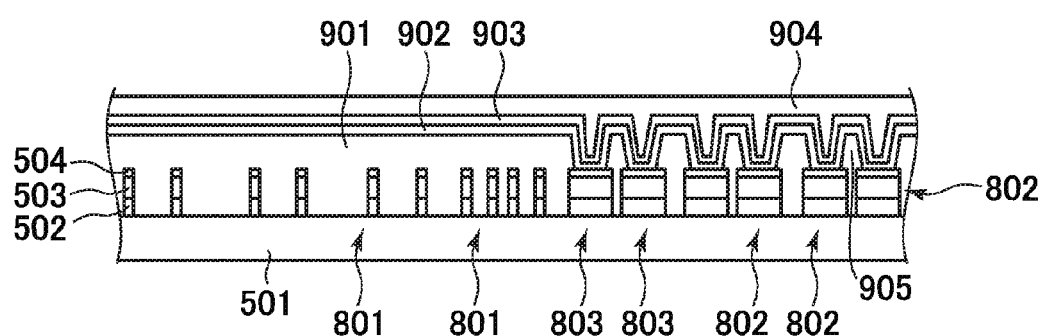
FIG. 9B is a view for illustrating an example of an IVB-IVB cross section of FIG. 8B.

Next, with reference to FIG. 9A and FIG. 9B, a part of the cross section of the display device formed as described above is described. In this case, FIG. 9A corresponds to an IVA-IVA cross section of FIG. 8A, and FIG. 9B corresponds to an IVB-IVB cross section of FIG. 8B.

As illustrated in FIG. 9A, on the TFT layer 501, the plurality of anode electrodes 802, anode electrodes 803 of the dummy pixels (dummy anode electrodes), and dummy electrodes 801, which are all subjected to etching as described above, are arranged. Further, on the TFT layer 501 having the plurality of anode electrodes 802 arranged thereon, an insulating layer 901 (rib) is arranged, and on the insulating layer 901, an organic EL layer 902 is arranged. On the organic EL layer 902, an upper electrode 903 is arranged.

Further, on the upper electrode 903, a sealing film 904 is arranged. As described above, the pixel region 201 and the dummy pixel region 804 in which the dummy pixels are arranged include the anode electrodes 802 (lower electrodes) or the dummy anode electrodes 803, the organic EL layer 902, the upper electrode 903, and banks 905. Moreover, in the display device 100, in the terminal region 701 positioned on the outer side of the pixel region 201 and the dummy pixel region 804, the dummy electrodes 801 remain as illustrated in FIG. 9A.

On the above-mentioned sealing film 904, filler or the like (not shown) is further filled, and a filter substrate (not shown) including a color filter or other components is arranged so as to be opposed to the substrate 601 filled with the filler or the like. The sectional structure itself of the display device using the organic EL element is known, and hence detailed description thereof is omitted. Further, the cross section illustrated in FIG. 9B is similar to that in FIG. 9A except for the point that the number of the dummy electrodes 801 is reduced as the distance from the pixel region 201 is increased, and hence description thereof is omitted.

Figure 10A:
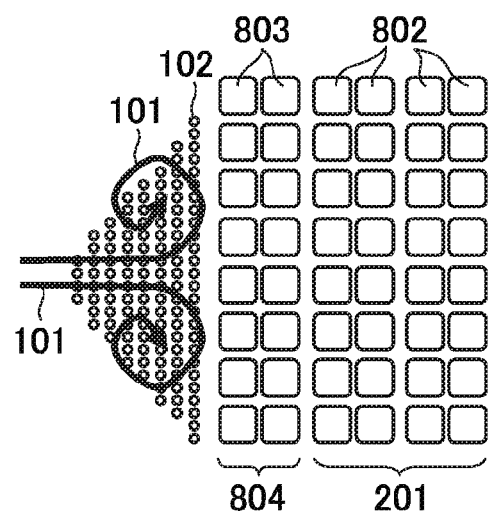
FIG. 10A is a view for illustrating an effect in the embodiment of the present invention.
Figure 10B:
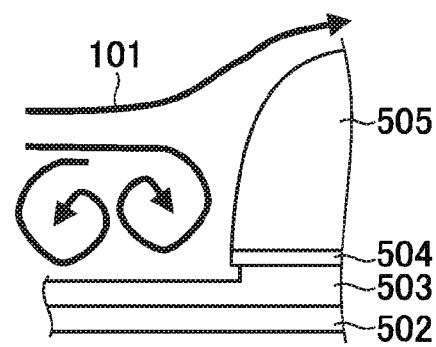
FIG. 10B is a view for illustrating the effect in the embodiment of the present invention.
Figure 10C:
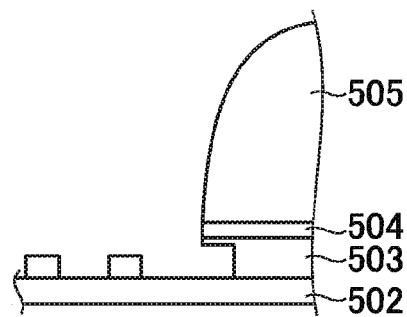
FIG. 10C is a view for illustrating the effect in the embodiment of the present invention.
Figure 11A:
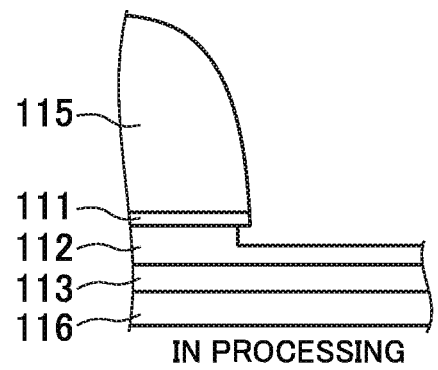
FIG. 11A is a view for illustrating an example of an object of the present invention.
Figure 11B:
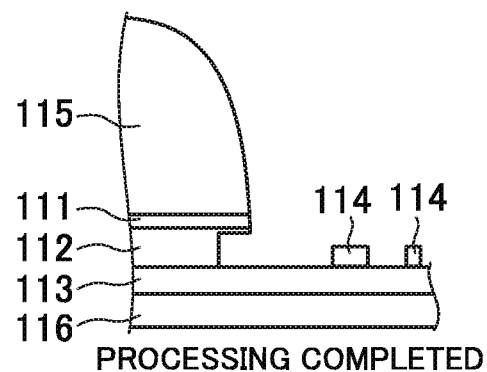
FIG. 11B is a view for illustrating the example of the object of the present invention.
Figure 11C:
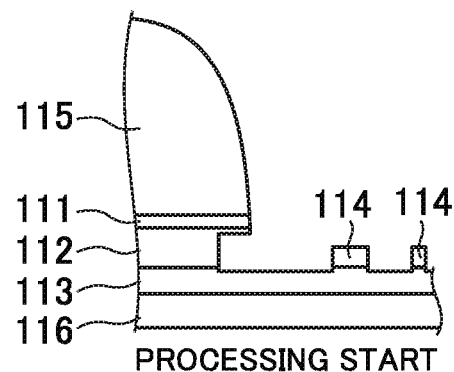
FIG. 11C is a view for illustrating the example of the object of the present invention.
Figure 11D:
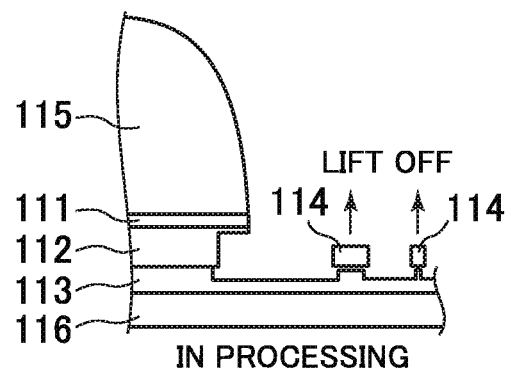
FIG. 11D is a view for illustrating the example of the object of the present invention.
Figure 11E:
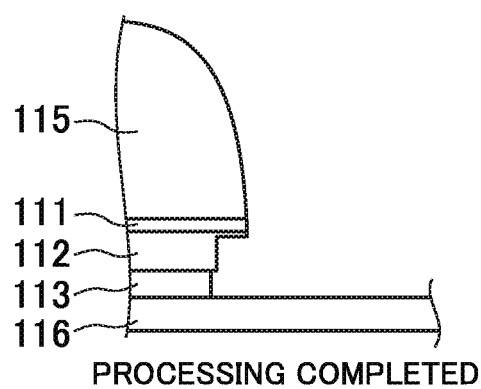
FIG. 11E is a view for illustrating the example of the object of the present invention.

According to this embodiment, the generation of Ag residues in the etching step of forming the anode reflective electrodes can be suppressed. Specific description is made with reference to FIG. 10A to FIG. 10C. FIG. 10A, FIG. 10B, and FIG. 10C are views for illustrating generation of Ag residues in a case where, as a comparative example, the pattern of the dummy electrodes 801 is not formed, unlike this embodiment. FIG. 10A corresponds to FIG. 8A and FIG. 8B. Further, FIG. 10B and FIG. 10C correspond to FIG. 11A and FIG. 11B, respectively.

As indicated by the arrow 101 of FIG. 10A and FIG. 10B, in mixed acid etching performed in the step of forming the anode reflective electrodes, a turbulent flow of mixed acid is generated due to change in coarseness and fineness of the pattern of the resists 505 (thickness of 1 µm or more) or the like. Then, due to sudden change in physical density between the pattern of the resists 505, which are arranged in the dummy pixel region 804, or the like and the region adjacent to the dummy pixel region 804 in the terminal region 701, the difference between a point at which the flow rate of the turbulent flow is large and a point at which the flow rate of the turbulent flow is small becomes remarkable. In this case, the etching of Ag by the mixed acid has a feature in that the etching rate in an immersion condition is large, while the etching rate in a stirring condition is small. In other words, the etching of Ag by the mixed acid has a feature in that the etching rate is large when the flow rate of the mixed acid is small, and the etching rate is small when the flow rate of the mixed acid is large. Therefore, there is a tendency that in a part in which the density suddenly changes as described above, a turbulent flow of mixed acid is generated to generate the Ag residues at the point at which the flow rate is large.

According to this embodiment, the pattern of the plurality of dummy electrodes 801 is formed so as to gradually change the physical density between the pattern of the resists 505, which are arranged in the dummy pixel region 804, or the like and another region (for example, the region adjacent to the dummy pixel region 804 in the terminal region 701). In this manner, the difference in flow rate of the turbulent flow of the etchant (mixed acid) described above can be suppressed. With this, for example, the display device having fewer residues can be realized.

The present invention is not limited to the above-mentioned embodiment, and various modifications can be made thereto. For example, the configuration described in the embodiment may be replaced by substantially the same configuration, a configuration having the same action and effect, or a configuration that can achieve the same object. For example, in the above, the case where the transparent conductive films 502 and 504 are made of ITO is described, but other transparent conductive materials such as indium zinc oxide (IZO) may be used. Further, in the above, as the display device, an organic EL display device is described as an example, but other self-emission type display devices may be employed.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A method of manufacturing an organic EL display device, comprising:
    forming a three-layer laminate by laminating a first transparent conductive film, a metal film, and a second transparent conductive film in order from a substrate side, wherein the three-layer laminate forms a plurality of anode electrodes arranged in a pixel region and a plurality of dummy electrodes arranged on an outer side of the pixel region;
    subjecting the second transparent conductive film and the metal film to etching; and
    subjecting the first transparent conductive film to etching, wherein a number of the plurality of dummy electrodes per area is reduced as a distance from the pixel region is increased.

2. The method of manufacturing an organic EL display device according to claim 1, wherein the number of the plurality of dummy electrodes is reduced as the distance from the pixel region is increased.

3. The method of manufacturing an organic EL display device according to claim 1, wherein the etching of the second transparent conductive film and the metal film is carried out under a state in which the substrate is inclined.

4. The method of manufacturing an organic EL display device according to claim 3, wherein the number of the plurality of dummy electrodes per area is reduced in a direction toward an upstream side of a flow of an etchant, which is caused by the inclination.

5. The method of manufacturing an organic EL display device according to claim 1, wherein the metal film is made of silver.

6. The method of manufacturing an organic EL display device according to claim 1, wherein the first transparent conductive film and the second transparent conductive film are made of ITO.

7. The method of manufacturing an organic EL display device according to claim 1, wherein the etching of the first transparent conductive film is carried out by oxalic acid.

8. The method of manufacturing an organic EL display device according to claim 1, wherein the etching of the second transparent conductive film and the metal film is carried out by mixed acid.

9. The method of manufacturing an organic EL display device according to claim 1, wherein the plurality of dummy electrodes are arranged on an upstream side of an etchant used in the etching of the metal film.

10. The method of manufacturing an organic EL display device according to claim 1, wherein the plurality of dummy electrodes are arranged adjacent to a plurality of dummy pixels arranged adjacent to and on the outer side of the pixel region.

11. An organic EL display device, comprising:
    a plurality of anode electrodes arranged in a pixel region; and
    a plurality of dummy electrodes arranged on an outer side of the pixel region,
    wherein a number of the plurality of dummy electrodes per area is reduced as a distance from the pixel region is increased,
    wherein the plurality of anode electrodes and the plurality of dummy electrodes comprise a three-layer laminate in which a first transparent conductive film, a metal film, and a second transparent conductive film are laminated in order from a substrate side.

* * * * *